(12) United States Patent
Yamauchi

(10) Patent No.: US 7,955,465 B2
(45) Date of Patent: Jun. 7, 2011

(54) DISPLAY ELEMENT AND METHOD OF MANUFACTURING DISPLAY ELEMENT

(75) Inventor: Taisuke Yamauchi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 205 days.

(21) Appl. No.: 12/068,806

(22) Filed: Feb. 12, 2008

(65) Prior Publication Data
US 2008/0194166 A1    Aug. 14, 2008

Related U.S. Application Data

(62) Division of application No. 11/094,030, filed on Mar. 31, 2005, now abandoned.

(30) Foreign Application Priority Data

Apr. 30, 2004 (JP) ................ 2004-135940
May 18, 2004 (JP) ................ 2004-147680

(51) Int. Cl.
B29C 65/48 (2006.01)
B32B 37/12 (2006.01)
B32B 37/14 (2006.01)
B32B 38/06 (2006.01)

(52) U.S. Cl. ........ 156/247; 156/249; 264/1.31; 264/1.9; 264/2.7

(58) Field of Classification Search ................ 156/230, 156/242, 247, 249; 313/498, 504; 264/1.31, 264/1.34, 1.6, 1.9, 2.7, 106, 107, 284; 425/363, 425/373, 383, 384, 385, 404
See application file for complete search history.

(56) References Cited

U.S. PATENT DOCUMENTS

| 3,657,474 | A  | * | 4/1972  | Turnrose ........................ 348/835 |
| 4,601,861 | A  | * | 7/1986  | Pricone et al. ................. 264/1.6 |
| 5,171,624 | A  | * | 12/1992 | Walter ........................... 428/156 |
| 5,229,882 | A  | * | 7/1993  | Rowland ....................... 359/530 |
| 6,046,543 | A  |   | 4/2000  | Bulovic et al. |
| 6,091,195 | A  |   | 7/2000  | Forrest et al. |
| 6,174,578 | B1 | * | 1/2001  | Holley .......................... 428/40.1 |
| 7,045,442 | B2 | * | 5/2006  | Maruyama et al. ........... 438/458 |
| 2002/0000772 | A1 |   | 1/2002 | Kitahara |
| 2002/0063975 | A1 | * | 5/2002 | Kelly ............................ 359/832 |
| 2003/0164679 | A1 |   | 9/2003 | Hamano et al. |
| 2003/0230972 | A1 |   | 12/2003 | Cok |

FOREIGN PATENT DOCUMENTS

| JP | A 06-005367  | 1/1994  |
| JP | A-10-189251  | 7/1998  |
| JP | A 2000-315582 | 11/2000 |
| JP | A-2000-323272 | 11/2000 |
| JP | A-2001-332388 | 11/2001 |
| JP | A-2003-282255 | 10/2003 |

\* cited by examiner

*Primary Examiner* — Philip C Tucker
*Assistant Examiner* — Sing P Chan
(74) *Attorney, Agent, or Firm* — Oliff & Berridge, PLC

(57) ABSTRACT

A display element includes a light emitting unit that supplies light; and an angle converting unit including a reflection surface, an output surface, and a flat surface. The angle converting unit converts an angle of the light by reflecting the light toward the output surface. The light emitting unit is arranged in a matrix in two directions substantially perpendicular each other on a standard plane. An inequality $0 \leq t < p$ $(p-d-f)(\tan \theta a)/(p+d-f)$ is satisfied, where t is a distance between the flat surface and the output surface, p is a pitch of the light emitting unit arranged in a predetermined direction, d is a length of the light emitting unit, f is a length of the flat surface, and $\theta a$ is an angle between the reflection surface and the standard plane.

7 Claims, 12 Drawing Sheets

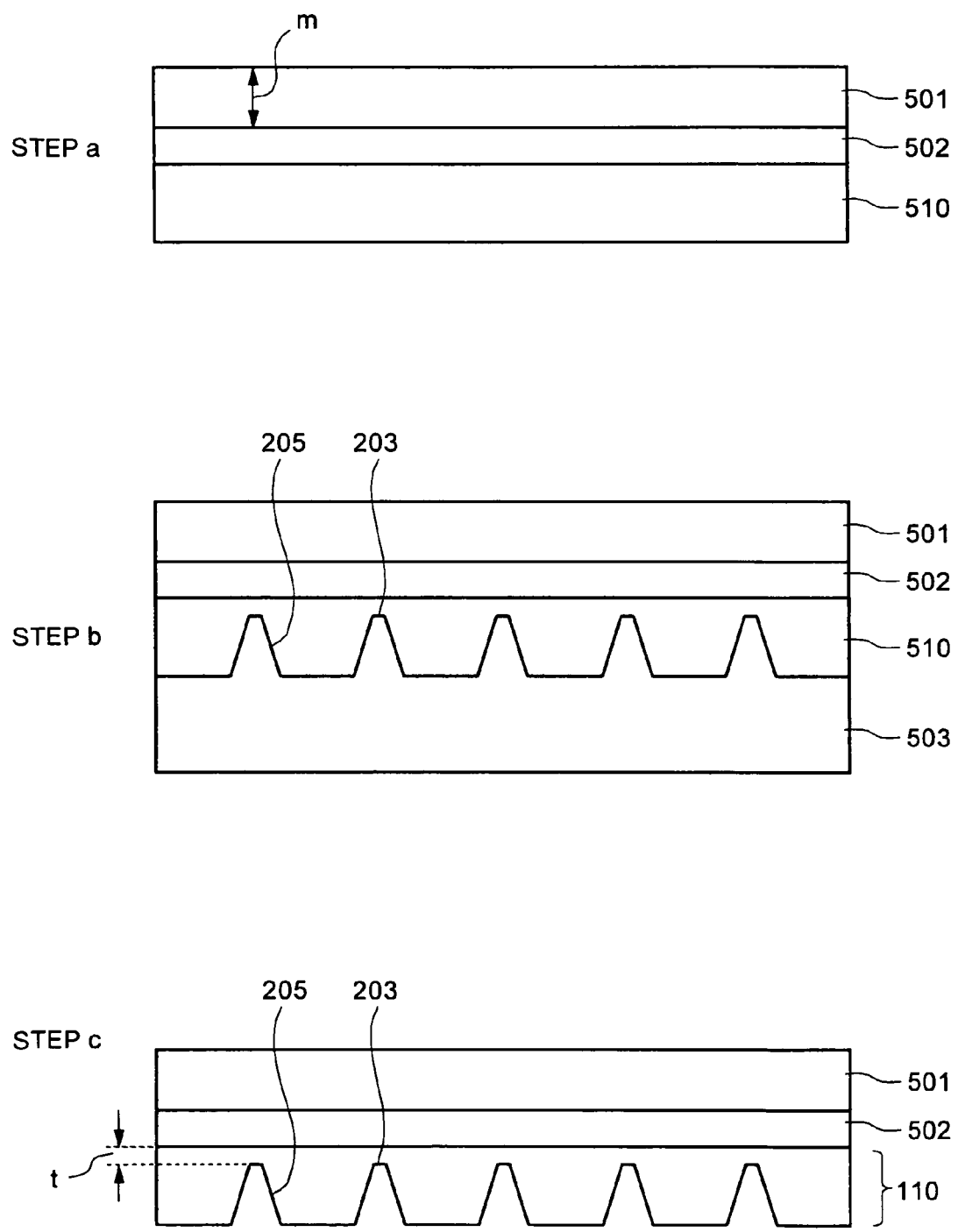

STEP d

STEP e

DISPLAY ELEMENT AND METHOD OF MANUFACTURING DISPLAY ELEMENT

This is a Division of application Ser. No. 11/094,030 filed Mar. 31, 2005, which is now abandoned. The disclosure of the prior application is hereby incorporated by reference herein in its entirety.

CROSS-REFERENCE TO RELATED APPLICATIONS

The present document incorporates by reference the entire contents of Japanese priority documents, 2004-135940 filed in Japan on Apr. 30, 2004 and 2004-147680 filed in Japan on May 18, 2004.

BACKGROUND OF THE INVENTION

1) Field of the Invention

The present invention relates to a display element and a method of manufacturing the display element, and more particularly, to an organic electroluminescence (EL) element and a method of manufacturing the EL element.

2) Description of the Related Art

An organic EL display using organic EL elements is currently in use. The organic EL display has a substrate made of a transparent material on an emission side and on a side opposite to the emission side of the display. Since each layer that constitutes the organic EL element is extremely thin, the substrate is provided to fix and reinforce each layer. Light from a light emitting unit in the organic EL element is transmitted through the substrate on the emission side of the organic EL display and emitted to the outside of the display. A portion of the light from the light emitting unit sometimes experiences a total reflection from a boundary of the substrate on the emission side and absorbed in the inside of the organic EL display. To avoid this, various technologies have been proposed to change an angle of the light from the light emitting unit in the organic EL display in such a manner that the light enters an output surface of the substrate at an angle equal to or smaller than a critical angle are proposed as described in, for example, Japanese Patent Application Laid-Open. No. 100189251, Japanese Patent Application Laid-Open No. 2001-332388, and Japanese Patent Application Laid-Open No. 2000-323272.

The technology disclosed in Japanese Patent Application Laid-Open No. 10-189251 and the technology disclosed in Japanese Patent Application Laid-Open No. 2001-332388 involve providing a reflection surface that reflects the light from the light emitting unit to change the angle of the light. It is very difficult to provide a structure having only a reflection surface without providing a substrate or the like on the emission side of the light emitting unit. Therefore, it is conceivable to provide the reflection surface on the emission side substrate at a position corresponding to a periphery of the light emitting unit. In the configuration in which the reflection surface is provided on the substrate at a position corresponding to a periphery of the light emitting unit, a portion of the light from the light emitting unit totally reflects from the output surface of the substrate and enters the reflection surface provided in a periphery of a light emitting unit in another pixel. The light that enters the reflection surface of another pixel is considered to reflect from the reflection surface and an electrode in the light emitting unit and allowed to emit from the output surface of the substrate.

However, when light supplied from a light emitting unit of one pixel enters a reflection surface provided corresponding to another pixel, so-called a crosstalk in which light of a different pixel is emitted may occur. The crosstalk may lead to deteriorations of image quality such as blurring of the contour of an image and recognition of a ghost image that cannot be displayed. The technology disclosed in Japanese Patent Application Laid-Open No. 2003-323272 involves providing a diffuser on the emission side of the substrate. Even when a diffuser is provided, crosstalk may occur similarly to the technologies described in Japanese Patent Application Laid-Open No. 10-189251 and Japanese Patent Application Laid-Open No. 2001-332388. As a result, it is necessary to prevent the deterioration of image quality in displays including organic EL displays from occurring in order to emit light from the light emitting unit efficiently.

The organic EL display may have a reduced contrast due to illumination in the room or outside light such as solar radiation. In the case of organic EL displays with a reflection electrode in the light emitting unit, the outside light that enters the light emitting unit from the observer side reflects from the reflection electrode, so that the outside light together with display light travels to the observer side, thereby causing a reduction in contrast. To reduce such a reduction in contrast, a technology involving using a low reflection electrode made of a low reflective material in the light emitting unit of the organic EL display is conceived. Provision of a low reflective electrode in the light emitting unit leads to a reduction in reflection toward the observer side of the outside light that enters the light emitting unit to minimize a reduction in contrast.

The technology disclosed in Japanese Patent Application Laid-Open No. 10-189251 involves providing a reflection surface in the periphery of the light emitting unit. To change the angle of light from the light emitting unit and minimizing the reduction in contrast simultaneously, it may be considered sufficient to provide a reflection surface in the periphery of the light emitting unit and a low reflection electrode in the light emitting unit. However, when the reflection surface is provided in the periphery of the light emitting unit, the outside light that enters the reflection surface may be reflected directly in the direction of the observer side. The outside light that travels from the reflection surface in the direction of the observer without entering the low reflection electrode may be considered to be a cause of a reduction in contrast. The outside light may travel in the direction of the observer side after being reflected between the reflection surfaces as well as traveling as it is in the direction of the observer side after entering the reflection surface. Thus, when a reflection surface and a low reflection electrode are provided parallelly, the outside light may be returned in the direction of the observer without entering the low reflection electrode.

The present invention has been made in light of the problems and it is an object of the present invention to provide a display capable of minimizing a reduction in image quality in emitting light from the light emitting unit and a method of manufacturing the display.

SUMMARY OF THE INVENTION

To solve the above problems, and to achieve the goal, a display element according to one aspect of the present invention includes a light emitting unit that is provided on a standard plane, and supplies light; and an angle converting unit including a reflection surface that is provided on a periphery of the light emitting unit, and reflects the light from the light emitting unit, an output surface that outputs the light from the light emitting unit and the reflection surface, and a flat surface that is provided between the reflection surfaces in parallel with the output surface. The angle converting unit converts an angle of the light by reflecting the light incident on the reflection surface from the light emitting unit toward the output surface. The light emitting unit is arranged in a matrix in two directions substantially perpendicular each other on the standard plane. A geometrical shape of the angle converting unit satisfies following inequality $$0 \leq t < p(p-d-f)(\tan \theta a)/(p+d-f) \quad (1)$$

where t is a distance between the flat surface and the output surface, p is a pitch at which the light emitting unit is arranged in a predetermined direction, d is a length of the light emitting unit in the predetermined direction, f is a length of the flat surface in the predetermined direction, and θa is an angle between the reflection surface and the standard plane.

The angle converting unit of the display element has reflection surfaces that reflect the light from the light emitting units to change the angle of the light with respect to the standard plane. The light that reflects from the reflection surfaces is converted to light having an angle with respect to the standard plane smaller than the critical angle on the output surface. The light that reflects from the reflection surfaces and travels toward the output surface totally reflects from the output surface and emitted to the outside. The light that is generated in the light emitting unit and is not incident to the reflection surfaces travels as it is toward the output surface of the angle converting unit. When the distance between the reflection surfaces and the output surface is large, the light from the light emitting unit which light travels obliquely toward the output surface without being incident to the reflection surfaces may sometimes be incident to the output surface at an angle equal to or greater than the critical angle. The light that totally reflects from the output surface does not return toward the light generating layer and travels in the direction toward other pixels. To reduce the occurrence of blurring of images or appearance of ghost images, the light that travels toward the other pixels must be reduced.

The display element that is configured to satisfy the inequality (1) above can emit the light from the light emitting unit within the region of adjacent two pixels even when the light form the light emitting unit of a pixel totally reflects from the reflection surfaces.

According to the present invention, the geometrical shape of the angle converting unit preferably satisfies following inequality $$0 \leq t < p(p-d-f)(\tan \theta a)/2(p+d-f). \quad (2)$$

The display element configured to satisfy the inequality (2) above allows the light from the light generating portion in a region of one pixel that is adjacent in a predetermined direction to the pixel in which the light has been generated even when the light totally reflects from the emission surfaces. By limiting the occurrence of the crosstalk in the display element in a region of up to one pixel, a display element that can reduce the deterioration of image quality can be obtained.

According to the present invention, the reflection surface has a longitudinal direction in at least one of the two directions substantially perpendicular each other on the standard plane. With the display element with reflection surfaces in at least one of the two directions, the occurrence of the crosstalk can be limited to a predetermined range to reduce the deterioration of image quality.

A method according to another aspect of the present invention, which is for manufacturing a display element that includes a light emitting unit that is provided on a standard plane, and supplies light; and an angle converting unit including a reflection surface that is provided on a periphery of the light emitting unit, and reflects the light from the light emitting unit, an output surface that outputs the light from the light emitting unit and the reflection surface, and a flat surface that is provided between the reflection surfaces in parallel with the output surface, includes bonding temporarily a holding substrate to a surface of a parallel plate; forming the reflection surface at a predetermined distance from a surface on which the holding substrate is temporarily bonded by pressing a mold having the predetermined pattern to other surface of the parallel plate opposite to the surface on which the holding substrate is temporarily bonded; bonding the surface of the parallel plate on which the reflection surface is formed and a substrate on which the light emitting unit is arranged in advance; and peeling the holding substrate temporarily bonded from the parallel plate.

With the display element of which the distance between the position of the extremity of each reflection surface on the side of the emission surface and the emission surface is adjusted, the light from the light generating portions is prevented from being emitted at a position more remote by a region of two pixels from the pixel in which the light has been generated. The crosstalk occurs in the display element increasingly when the distance between the reflecting surfaces and the emission surface increases. Accordingly, it is necessary to produce a display element having a relatively small distance between the reflection surfaces and the emission surface to obtain a display element with reduced occurrence of crosstalk. The method of producing a display element according to one aspect of the present invention includes transferring a pattern to a parallel plate to which a holding substrate is temporarily bonded. By using the holding substrate, the breakage of the parallel plate can be prevented even when the pattern is transferred to a thin parallel plate. The pattern transfer onto a thin parallel plate enables one to easily produce display elements having a short distance between the reflection surfaces and the emission surface. By transferring a pattern to a thin parallel plate, a display element having a short distance between the reflection surfaces and the emission surface can be produced with ease. The breakage of the holding substrate can be prevented by temporarily bonding the holding substrate with an adhesive that is peelable by irradiation of ultraviolet-rays, or by heating or with water. This reduces the breakage of the parallel plate during the production process and enables production of a display element with a reduced possibility of the occurrence of crosstalk.

A display element according to still another aspect of the present invention includes a light emitting unit that is provided on a standard plane, and supplies light; and an angle converting unit that includes a reflection surface provided on a periphery of the light emitting unit, and converts an angle of the light by reflecting the light incident on the reflection surface from the light emitting unit toward an output surface. A geometrical shape of the angle converting unit satisfies following inequality $$\{a \sin(1/n)\}/2 + \pi/4 < \theta b < \pi/2 \quad (3)$$

where θb is an angle in radian between the reflecting surface and the standard plane, and n is refractive index of a material of which the angle converting unit is made.

With the display element having an angle at which the reflection surfaces are provided with respect to the standard plane which angle satisfies the inequality (3), the external light that enters the emission surface can travel to the light generating portion or other reflection surface without reflecting the external light to the emission side. The amount of the component of the light that reflects from the reflection surfaces and travels to the light generating portion, which component travels to the emission side, can be reduced by, for example, providing a low reflection electrode in each light generating portion. Some of the light that travels from a reflection surface to another reflection surface may travel to the emission side. The light that travels to the emission side again after reflecting from the reflection surfaces twice totally reflects from the emission surface of the angle changing portion to travel toward the light generating portion. The amount of the light that travels toward the light generating portion after reflecting twice from the reflecting surfaces totally reflects from the emission surface can be reduced by reflecting again from the reflection surface or the like.

Accordingly, the display element can prevent the external light that is incident to the reflection surface from the emission side from being emitted toward the side of the observer after being reflected from the reflection surface once or twice. The amount of the external light that reflects from the reflection surfaces three times or more can be reduced by repeating the reflection. The amount of the external light that is incident to the light generating portion from the emission side and then travels toward the emission side can be reduced by providing the low reflection electrode. When a polarizing plate is provided on the emission side of the angle changing portion, the light, in particular that reflects twice from the reflecting surfaces cannot in some cases be blocked with the polarizing plate due to a change in phase. According to the present invention, the amount of the light that reflects twice from the reflecting surfaces and then travels toward the emission side can be reduced. Accordingly, a display element that can reduce the deterioration of image quality when the light from the light generating portions is emitted efficiently can be obtained.

According to the present invention, the light emitting unit is arranged in a matrix in two directions substantially perpendicular each other on the standard plane, and the reflection surface has a longitudinal direction in at least one of the two directions. With the display element configured to include reflection surfaces in one of the two directions that cross at substantially right angles to each other, the deterioration of image quality can be reduced when the light from the light generating portions is emitted efficiently.

According to the present invention, the light emitting unit is arranged in a matrix in two directions substantially perpendicular each other on the standard plane, and the angle converting unit includes a first reflection surface having a longitudinal direction in a first direction from among the two directions; and a second reflection surface having a longitudinal direction in a second direction from among the two directions. By providing the reflection surfaces that are oblong in the first direction and the reflecting surfaces that are oblong in the second direction, the amount of the external light can be reduced not only by reflections between the opposing reflection surfaces but also by reflections between the adjacent reflection surfaces. This can further reduce the deterioration of contrast.

According to the present invention, the light emitting unit includes a low reflection portion at which a reflectivity of light incident to the light emitting unit from the output surface is equal to or less than a predetermined value. By providing the low reflection portion in the light generating portion, travel of the external light that is incident to the light generating portion toward the observer can be minimized. This can reduce the deterioration of contrast.

The display element according to the present invention further includes a polarizing plate that transmits only a polarized light in a specific oscillation direction on the output surface of the angle converting unit. When the polarizing plate is provided on the emission side of the angle changing portion, only the polarized light from the external light, which polarized light vibrates in the specific oscillation direction, is incident to the display element. For example, when a phase plate is provided on the side of the light generating portion of the polarizing plate, the oscillation direction of the polarized light incident to the display element is changed with the phase plate. The polarized light, the oscillation direction of which is changed with the phase plate from the specific oscillation direction to an oscillation direction different from the specific oscillation direction does not transmit through the polarizing plate and is blocked. By providing the polarizing plate, the travel of the external light toward the observer can be minimized. This can reduce the deterioration of contrast.

According to the present invention, a structure formed with the first reflection surface and a structure formed with the second reflection surface have substantially same height in a direction normal to the standard plane. The reflection surfaces are configured to have inclined surfaces that widen from the light generating portion to the emission side. The reflection surfaces provided on a display element and the reflection surfaces provided on a display element adjacent thereto abut on a position on the emission side to form a structure. On the positions of the structures on the emission side are formed edges. When the height of the structure that are oblong in the first direction is different from the height of the structure that are oblong in the second direction, the external light that reflects from the edge of a structure reflects from the edge of another structure that is adjacent to the former structure before the external light is emitted through the emission surface. The light that reflects twice from the reflection surfaces may sometimes transmit through the polarizing plate due to a change in phase. By making the height of the structure that is oblong in the first direction and the height of the structure that is oblong in the second direction substantially the same, the light that reflects from the edge of a structure can be prevented from reflecting from the reflection surfaces of another structure adjacent to the former structure. Since the reflection occurs only at the edge, a change in phase is small, the light that reflects from the edge is blocked with the polarizing plate. In this manner, the emission of the external light that reflects from the edge of the structure toward the observer can be minimized. This can reduce the deterioration of contrast.

According to the present invention, the angle converting unit further includes a light absorbing portion that absorbs light at a position on the reflection surface on a side of the output surface. The reflection surfaces provided in a display element and the reflection surfaces provided in a display element that is adjacent to the display element abut on a position or extremity on the side of the emission surface to form edges. By providing the light absorbing portion at the position of the edges, the reflection of the external light that is incident to the edges can be prevented from reflecting from the edges. Prevention of reflection of the external light that is incident to the edges reduces the amount of the external light that travels toward the observer and reduces the deterioration of contrast. With the light absorbing portion provided on the edges at which the reflecting surfaces abut, the absorption of the display light by the light absorbing portion can be minimized. Accordingly, the display element that can absorb only the external light efficiently can be realized with minimizing the deterioration of contrast.

The other objects, features, and advantages of the present invention are specifically set forth in or will become apparent from the following detailed description of the invention when read in conjunction with the accompanying drawings.

BRIEF DESCRIPTION OF THE DRAWINGS

FIG. 5A is a schematic of a production method of manufacturing a display element according to a second embodiment of the present invention;

DETAILED DESCRIPTION

Exemplary embodiments of the present invention are explained in detail with reference to the accompanying drawings.

Figure 1:
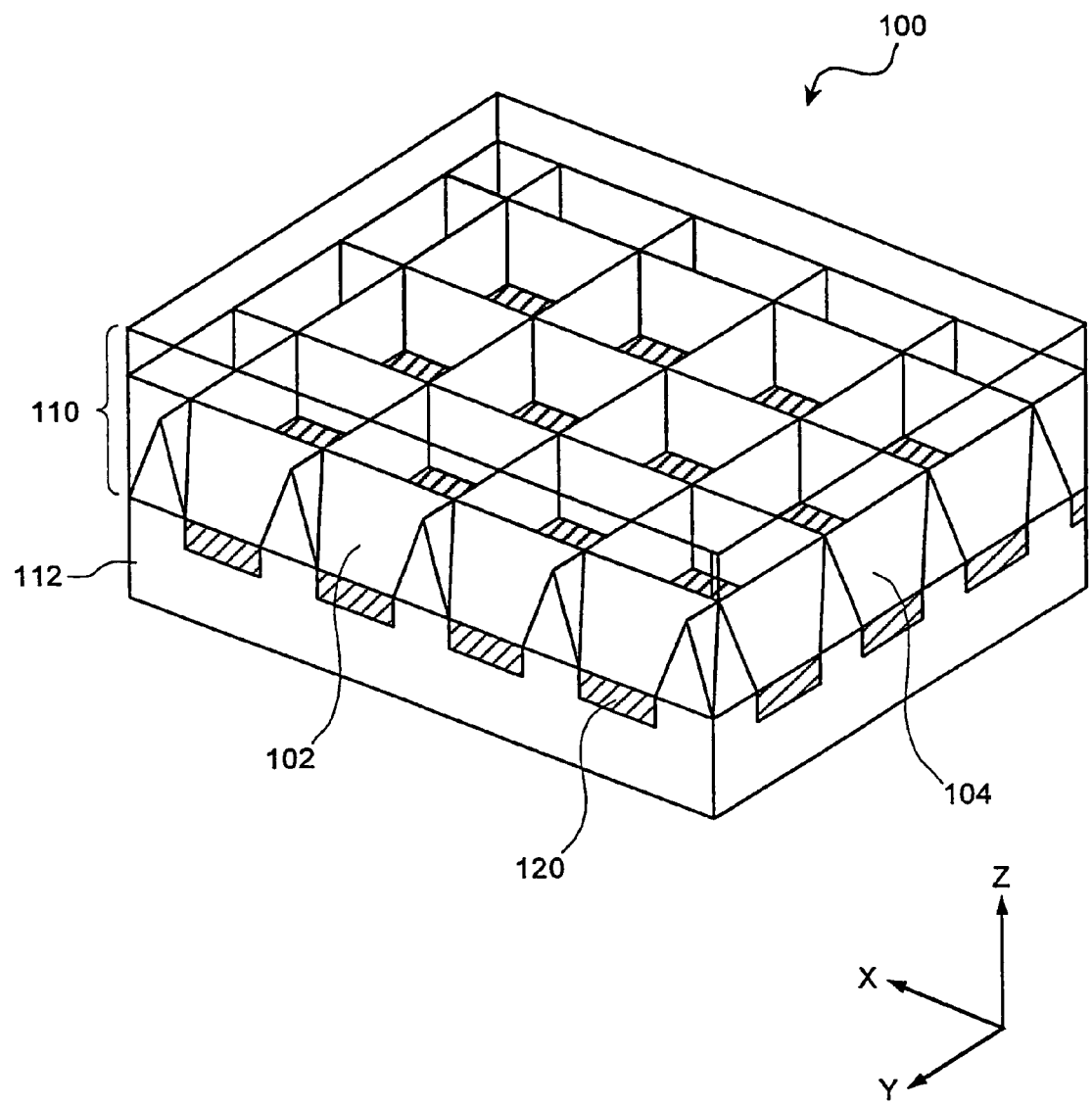
FIG. 1 is a perspective view of a main part of the display device with a display element according to a first embodiment of the present invention.

FIG. 1 is a schematic perspective view of a main part of a display device 100 with a display element according to a first embodiment of the present invention. The display device 100 is an organic EL display that includes organic EL elements, which are display elements according to the first embodiment of the present invention. The display device 100 includes an angle converting unit 110 laminated on a substrate 112. The substrate 112 is an organic EL panel that has a plurality of light emitting units 120. The light emitting units 120 are provided on a standard plane SS that is parallel to a main surface of the substrate 112 in the form of a matrix that extends in X and Y directions, which are substantially at right angles to each other.

The angle converting unit 110 includes a parallel plate made of a transparent resin material. The angle converting unit 110 includes prism structures 102 and 104 on a surface thereof on the side of the substrate 112. Each of the prism structures 102 and 104 has reflection surfaces provided in the periphery of each light emitting unit 120 and a flat surface provided between the reflection surfaces. The prism structures 102 and 104 are arranged in the form of a lattice between the light emitting units 120 in such a manner that the longitudinal directions of the prism structures 102 and 104 correspond to the X direction and Y direction, respectively. The angle converting unit 110 has an output surface 11 θa over an entire surface thereof on the side opposite to the substrate 112. The output surface 110a is in a plane that is substantially parallel to the standard plane. One unit of the organic EL element includes one light emitting unit 120 and a portion of the angle converting unit 110, which portion corresponds to the light emitting unit 120. The display device 100 includes a plurality of the organic EL elements arranged corresponding to pixels. In FIG. 1, a perspective view of a portion having arranged therein four organic EL elements in the X direction and three organic EL elements in the Y direction is shown as a main portion of the display device 100.

More particularly, the light emitting unit 120 has two opposing electrode layers and a functional layer provided between the electrode layers. When voltage is applied to between the two electrode layers using an external power source, the functional layer of the light emitting unit 120 supplies light. One of the electrodes in each light emitting unit 120 is connected to a TFT circuit (not shown) that is provided for each organic EL element. The display device 100 displays an image by a so-called active matrix method in which each organic EL element is driven when electrical access is made to each TFT circuit through various interconnections.

The light emitting unit 120 supplies light to the side where the angle converting unit 110 is provided. Light supplied from the light emitting unit 120 in a direction nearly perpendicular to the standard plane is emitted from the output surface of the angle converting unit 110 directly. Light supplied from the light emitting unit 120 obliquely reflects from the reflection surfaces of the prism structures 102 and 104 and then emitted from the output surface of the angle converting unit 110. The angle converting unit 110 reflects light that is supplied from the light emitting unit 120 and enters the reflection surface in the direction of the output surface to change the angle of the light. The angle of the light that travels obliquely from the light emitting unit 120 is changed in such a manner that an incident angle of the light with respect to the output surface is equal to or smaller than the critical angle. The angle converting unit 110 changes the angle of the light from the light emitting unit 120 to thereby reduce total reflection on the output surface. With the angle converting unit 110, the display device 100 allows light from the light emitting unit 120 to be taken out to the outside efficiently.

Figure 2:
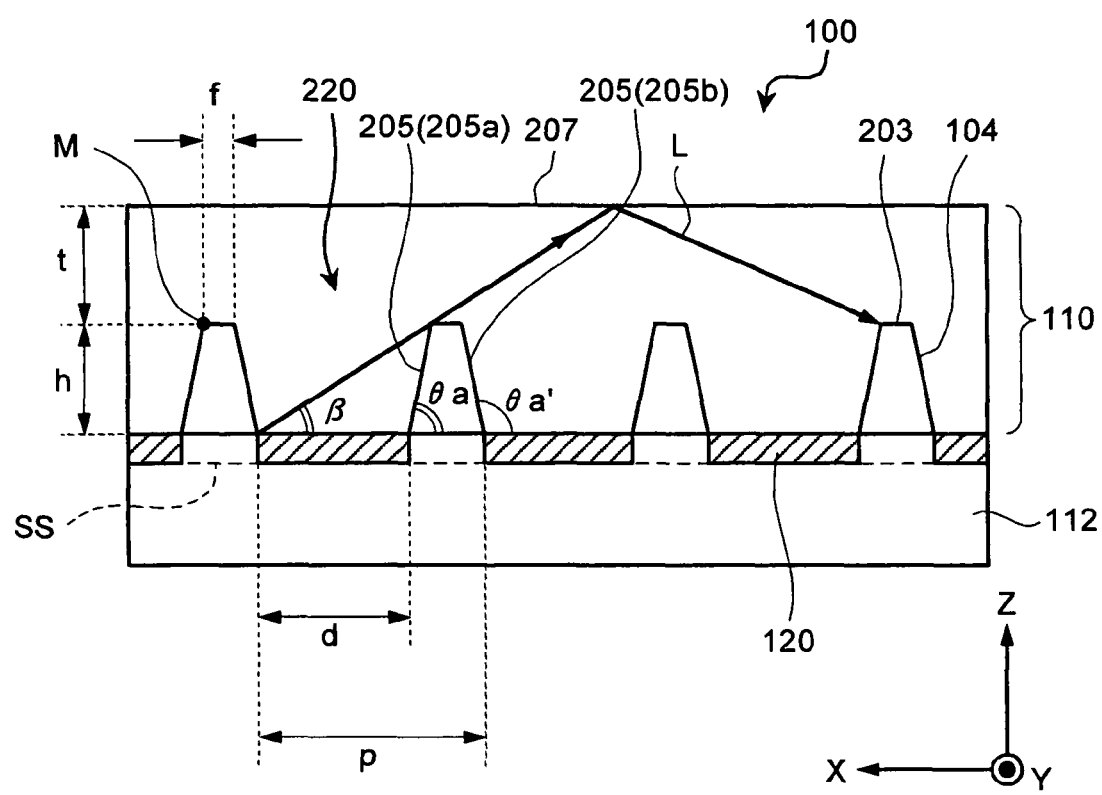
FIG. 2 is a cross-section of the main part of the display device shown in FIG. 1.

FIG. 2 is a cross-section of a main part of the display device 100. The prism structures 102 are arranged in parallel in the X direction. Each prism structure 102 has two reflection surfaces 205 provided on the side of the light emitting unit 120 and a flat surface 203 provided between the two reflection surfaces 205. One reflection surface 205a is an inclined plane that is substantially flat. The reflection surface 205a forms an angle θa with respect to the surface of the substrate 112, i.e., a plane that is parallel to the standard plane SS. Another reflection surface 205b is also an inclined plane that is substantially flat. The reflection surface 205b forms an angle θa' with the surface of the substrate 112. The angle θa' is substantially equal to (180°−θa). The reflection surfaces 205a and 205b on the both sides of the light emitting unit 120 are arranged inclined in such a manner that the space between the reflection surfaces 205a and 205b on the both sides of one light emitting unit 120 widen toward the output surface. The flat surfaces 203 are arranged facing to the output surface 207. The prism structures 102 have a cross-section of an isosceles trapezoid with the flat surface 203 being the upper base. The angle converting unit 110 is configured in such a manner that an intersection M between a tangent line of the reflection surface 205 and a tangent line of the flat surface 203 is at a predetermined distance between the standard plane SS and the output surface 207. The distance between the output surface and the extremity of the reflection surfaces on the side of the output surface is predetermined. In other words, assuming a distance between the intersection M and the output surface 207 to be "t", the angle converting unit 110 is configured in such a manner that t is a value within a predetermined range. The height, h, of the prism structures 102 and 104 is defined to a distance between the intersection M and the surface of the substrate on which the prisms are arranged. In FIG. 2, the flat plane 203 of each angle converting unit 110 is depicted in an enlarged scale to some extent as compared with that shown in FIG. 1 to explain that the flat surface 203 is provided.

Figure 3:
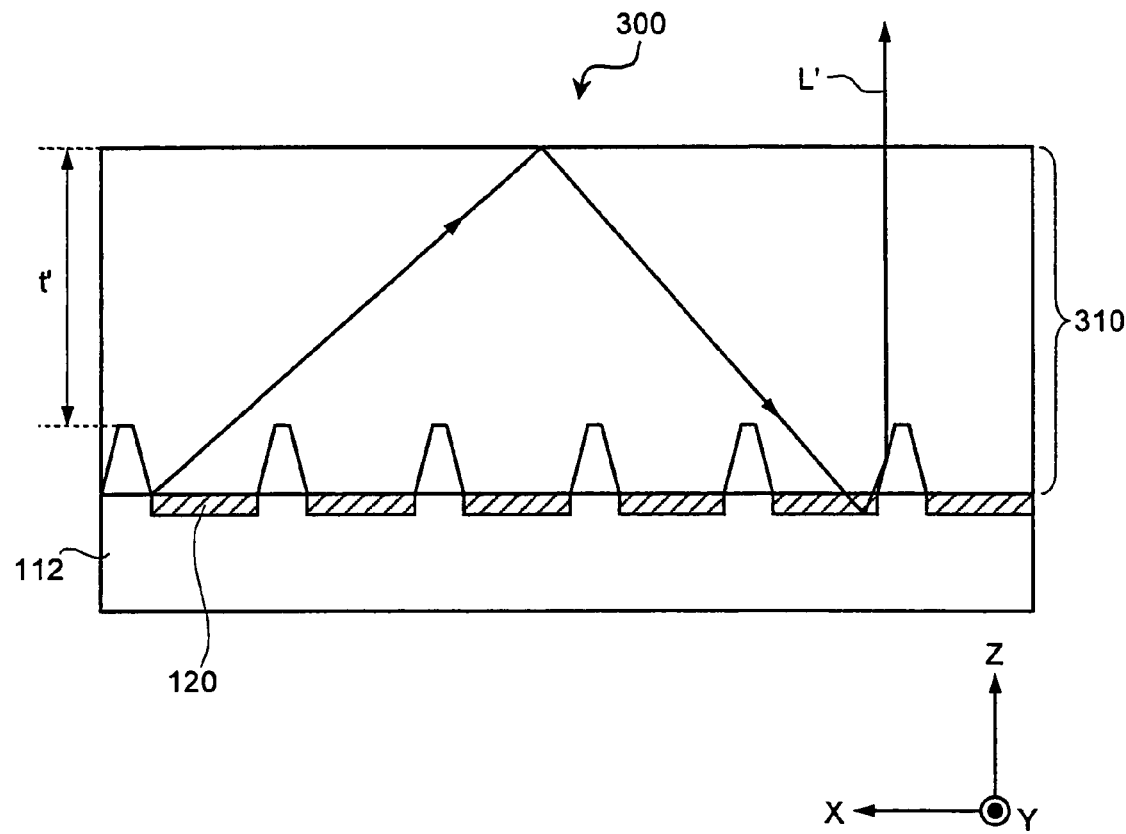
FIG. 3 is a schematic for explaining a crosstalk.

For comparison, an organic EL element of which the distance t is not controlled is explained. Since it is usually difficult to form prism structures 102 and 104 separately as individual components, the prism structures 102 and 104 are formed by embossing one of a pair of plates to form a contour of each prism structure and filling and sealing a space between the plates arranged in parallel with a sealant. Thick parallel plates are used as materials for preparing the angle converting units to avoid deformation or breakage of the plate upon the embossing. FIG. 3 is a diagram of an example of a display device 300 with an angle converting unit 310 that includes a pair of thick parallel plates. The angle converting unit 310 is configured in such a manner that assuming the distance between the intersection M and the output surface 207 to be t' and the height of the prism structures to be h', the distance t' is about 5 times the height h'.

A portion of light that travels obliquely from the light emitting unit 120 is not incident to the reflection surface and reaches to an output surface 307 of the angle converting unit 300. The light that is incident to the output surface 307 of the angle converting unit 310 at an angle greater than a critical angle totally reflects from the output surface and travels toward a point far from the light emitting unit 120 of the original pixel from which the light was emitted. Some of the light that reflected from the output surface 307 is incident to the light emitting units 120 of the other pixels or to the reflection surfaces of the prism structures and reflects from electrodes of the light emitting units 120 and the reflection surfaces of the prism structures and then emitted through the output surface 307 out of the angle converting unit 310. In some cases, crosstalk may occur in the display device 300 due to the light L' emitted from the pixels other than the original pixel. The crosstalk may cause deterioration of image quality, such as blurring of the contour of the image and appearance of ghost images that should not have been displayed. The greater the distance t', the more the amount of the light generated in the light emitting unit 120 of the original pixel and emitted from the pixel remote from the original pixel increases. Accordingly, the greater the distance 5', the more the contour of the image is blurred and the more the ghost image increases.

Referring back to FIG. 2, the organic EL element f the present invention in the display device 100 is configured so as to satisfy inequality (1)

$$0 \leq t < p(p-d-f)(\tan \theta a)/(p+d-f) \quad (1)$$

where t is a distance between the intersection M and the output surface 207, p is a pitch at which light emitting units 120 are arranged in the predetermined direction, which is the X direction, p being identical to the distance between respective centers of adjacent light emitting units 120, d is a length of the light emitting unit 120 in the predetermined direction, which is the X direction, f is a length of the flat surface 203 in the predetermined direction, which is the X direction; and θa is an angle between the reflection surface 205 and the standard plane SS. The angle converting unit 110 has a thickness that is equal to the sum of the height, h, of the prism structures 102 and the distance t.

The light incident to the output surface 207 at an angle equal to or smaller than the critical angle is emitted through the output surface 207 to the outside. On the other hand, the light incident to the output surface at an angle greater than the critical angle totally reflects from the output surface 207 and travels toward the light emitting unit 120 of the other pixel. The light L forms the smallest angle β with respect to the standard plane SS. With the organic EL element configured to satisfy the inequality (1) above, even when the light L with an angle β with respect to the standard plane SS totally reflects from the output surface 207, the reflected light is incident to the reflection surface 205 of a pixel after the next pixel from the original pixel from which the light was generated. In this manner, the display device 100 provided with the organic EL element satisfying the inequality (1) allows the light generated in a pixel to be emitted through the output surface 207 within the range of the adjacent one pixel even when the light from the light emitting unit 120 reflects totally from the output surface 207.

The organic EL element of the display device 100 may be configured to satisfy the inequality (2)

$$0 \leq t < p(p-d-f)(\tan \theta a)/2(p+d-f) \quad (2)$$

where t, p, d, d f, and θa have the same meanings as defined above. With the organic EL element that satisfies the inequality (2), the light L having an angle β with respect to the substrate is incident to the reflection surface 205 of a pixel after the next pixel in the direction in which the light travels even when the light L is totally reflected from the output surface 207. Therefore, with the organic EL element that satisfies the inequality (2) allows the light totally reflected from the output surface 207 to be emitted at a position adjacent to the original pixel 220 from which the light is generated in the X direction. With the display device 100 provided with the organic EL element that satisfies the inequality (2), the light from the light generating unit 120 can be emitted through the output surface 207 in the range corresponding to the pixel after the next pixel in the X direction. When the display device 100 is configured in such a manner that t=0, the entire light generated by the light emitting unit 120 can be emitted through the light output surface 207 within the range of the original pixel that includes the light emitting unit 120 that generated the light. Therefore, the organic EL element that causes no crosstalk can be obtained.

Figure 4:
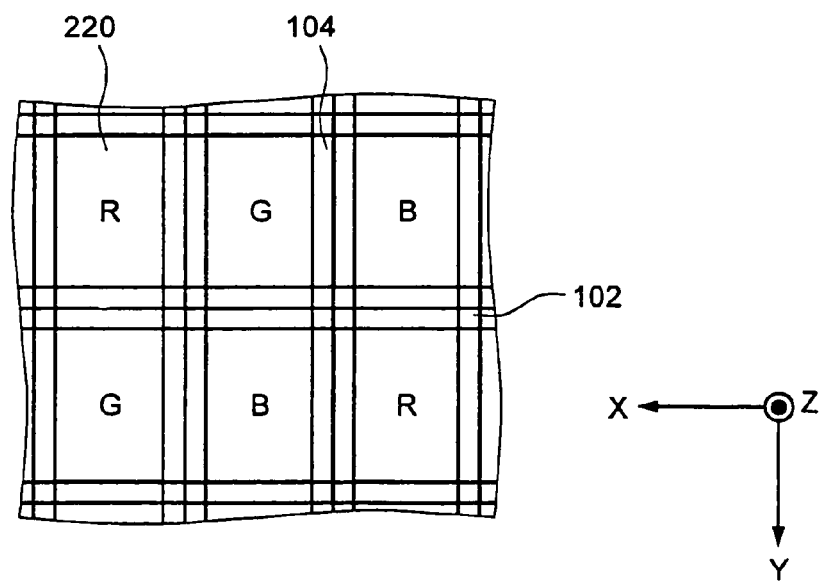
FIG. 4 is a schematic of an example of a layout of pixels and prism structures.

When a pixel for red (R) light (hereafter, also referred to as "pixel R"), a pixel for green (G) light (hereafter, also referred to as "pixel G"), and a pixel for blue (B) light (hereafter, also referred to as "pixel B") are arranged side by side in the X direction as shown in FIG. 4, each pixel for a full color image in the display device 100 includes the three pixels 220, i.e., the pixel R, the pixel G, and the pixel B. The observer can seldom recognize blurring of the images or appearance of ghost images when the position of the emission of light is shifted by two pixels or so in the X direction due to crosstalk.

The configuration in the Y direction of the angle converting unit 110 of the organic EL element may be the same as that in the X direction. In the Y direction, parameters p, d, and f in the inequality (1) are set to the pitch or lengths in the predetermined direction, i.e., Y-direction. By configuring the organic EL element in such a manner that the organic EL element satisfies the inequality (1) also in the Y direction, the occurrence of the crosstalk in the Y direction can be limited to a region of two pixels or less. With the above configuration, the observer seldom recognizes the occurrence of blurring of two pixels or so in the image displayed in the display device 100. For this reason, the observer can seldom recognize blurring of the images or appearance of ghost images when the position of the emission of light is shifted by two pixels or so in the Y direction due to crosstalk. The organic EL element of the display device 100 configured to satisfy the inequality (1) can limit the occurrence of the crosstalk to adjacent two pixels or less to minimize a reduction in image quality. This provides an effect that the deterioration of the image quality can be reduced when light is efficiently emitted from the light emitting units 120. By satisfying the inequality (2) above, the organic EL element of the display device 100 can further reduce the deterioration of the image quality.

Although the angle converting unit 110 of the display device is configured to have substantially planar reflection surfaces 205, the angle converting unit 110 may have curved reflection surfaces. In addition, the prism structures 102 and 104 in the angle converting unit 110 may be configured to have no flat surfaces between the reflection surfaces 205a and 205b of each prism structure. When no flat surface is present between the reflection surfaces 205a and 205b of each prism structure, the organic EL element may be configured to satisfy the inequality (4)

$$0 \leq t < p(p-d)(\tan \theta a)/(p+d) \qquad (4)$$

where t, p, d and θa have the same meanings as defined above.

Furthermore, the organic EL element may be configured to satisfy the inequality (5)

$$0 \leq t < p(p-d)(\tan \theta a)/2(p+d) \qquad (5)$$

where t, p, d and θa have the same meanings as defined above.

The organic EL element of the display device 100 is provided with prism structures 102 and 104 each having reflection surface 205 in the directions X and Y, which are two directions that cross at substantially right angles to each other in the standard plane SS. The organic EL element is not limited to one that is provided with both a reflection surface 205 having a longitudinal axis in the X direction and a reflection surface 205 having a longitudinal axis in the Y direction. It is satisfactory that the reflection surface 205 of the organic EL element has a longitudinal axis in one of the two directions that are at substantially right angles to each other. If the organic EL element is provided with reflection surfaces 205 that are oblong in at least one of the two directions that cross at substantially right angels to each other, the crosstalk can be reduced to a predetermined value or less. As a result, the deterioration of the image quality can be decreased when light is efficiently emitted from the light generating unit 120.

Figure 5B:
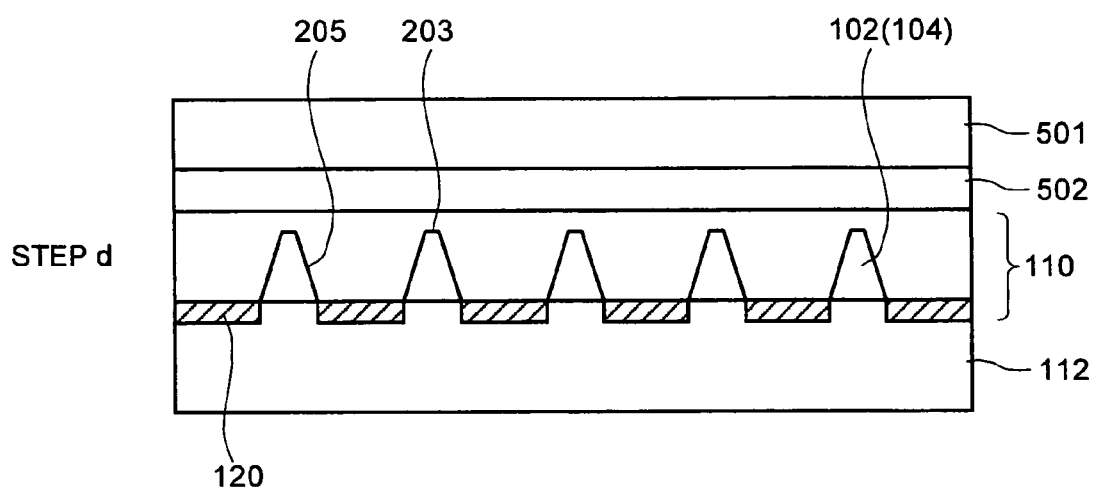
FIG. 5B is a schematic of a production method of manufacturing a display element according to the second embodiment of the present invention.
Figure 5B:
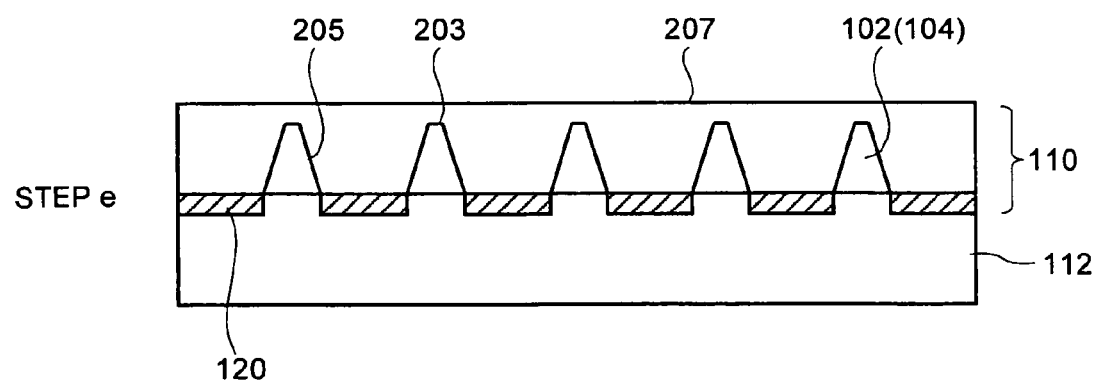

FIGS. 5A and 5B are schematics for explaining a method of manufacturing a display element according to a second embodiment of the present invention. The organic EL element in the display device 100 in the first embodiment above can be produced by the production method according to the second embodiment. First, in a step a, which is a temporary bonding step, a holding substrate 501 is temporarily bonded to a parallel plate 510 made of a transparent resin. The holding substrate 501 is a transparent plate having a predetermined thickness, m, with which breakage of the parallel plate 510 can be sufficiently prevented in a subsequent pattern transferring step described below. The temporary adhesion of the parallel plate 510 and the holding substrate 501 is performed through a temporary adhesion layer 502.

In a step b, which is a pattern transferring step, a mold 503 is pressed onto the parallel plate 510 on the side opposite to the side where the holding substrate 501 is temporarily bonded in the temporary bonding step. The pattern of the mold 503 is transferred to the parallel plate 510 by thermoforming, for example, a vacuum forming method or a pneumatic molding method. In a step c, the mold 503 is removed. As a result, the reflection surface 205 is formed at a predetermined distance, t, from the surface on which the holding substance 501 is temporarily bonded. The angle converting unit 110 is formed by processing the parallel plate 510 in the steps b and c.

In a step d, which is a laminating step, the surface of the angle converting unit 110, which is a parallel plate, that is formed of the reflection surfaces 205 in the step b and the substrate 112 that is previously provided with the light emitting units 120 are laminated with each other. The lamination of the angle converting unit 110 with the substrate 112 is performed with registration in position in such a manner that the light emitting unit 120 is arranged between adjacent two prism structures, or between two opposing reflection surfaces 205. As a result, the reflection surfaces 205, flat surfaces 203, and the surface of the substrate 112 define the form of the prism structures 102 and 104.

The reflection surfaces 205 can be formed by, for example, forming a metal thin film. The materials of the metal thin film that can be used include, for example, aluminum and silver. The metal thin film can be formed by vapor depositing or patterning a metal material on the surface of the angle converting unit 110 on the side of the substrate 112 before the angle converting unit 110 and the substrate 112 are laminated. When the reflection surfaces 205 are formed by the forming of a metal thin film, the prism structures 102 and 104 can be formed by filling an adhesive in the cavities formed in the angle converting unit 110 after the step c.

When no flat surfaces 203 are provided between the opposing reflection surfaces 205, the tips of the prism structures 102 and 104 may have an insufficient strength. The flat surfaces 203 are provided to ensure the strength of he tips of the prism structures 102 and 104. When the strength of the tips of the prism structures 102 and 104 is sufficient to prevent breakage of the prism structures 102 and 104, the prism structures 102 and 104 need not have the flat surfaces 203. The contours of the prism structures 102 and 104 may be defined by reflection surfaces 205 only. To provide the reflection surfaces 205 and the output surface 207 with a sufficiently small distance t from each other, it is desirable that the flat surfaces 203 be configured to have as small as possible an area so far as the breakage of the prism structures 102 and 104 can be prevented.

The reflection surfaces 205 may be total reflection surfaces. When the reflection surfaces 205 that are total reflection surfaces are provided, the prism structures 102 and 104 may be formed by filling an inert gas such as nitrogen gas in the cavities defined by the total reflection surfaces. The reflection surfaces 205 can totally reflect incident light by utilizing a difference in refractive index between the resin member that constitutes the angle converting unit 110 and the prism structures 102 and 104.

In a step e, which is a peeling step, the holding substrate 501, which is temporarily bonded to the parallel plate in the temporary bonding step a, is peeled off. To make it easy to peel the holding substrate 501, the temporary adhesion layer 502 is desirably made of an adhesive that can be peeled off by irradiation of ultraviolet rays, with heat or with water. By making the holding substrate 501 readily peelable from the angle converting unit 110, the breakage of the display device 100 can reduce. In this manner, the display device 100 can be produced.

By the production method according to the present embodiment, use of the strong holding substrate 501 can sufficiently prevent the parallel plate 510 from being broken even when a pattern is transferred to the thin parallel plate 510 using the mold 503. Since a pattern can be transferred to the thin parallel plate 510, an organic EL element with a short distance t between the reflection surface 205 and the emitting surface 207 can be readily produced. This enables production of organic EL elements that can reduce the occurrence of crosstalk. The breakage of the parallel plate during the production process can reduce.

Figure 6:
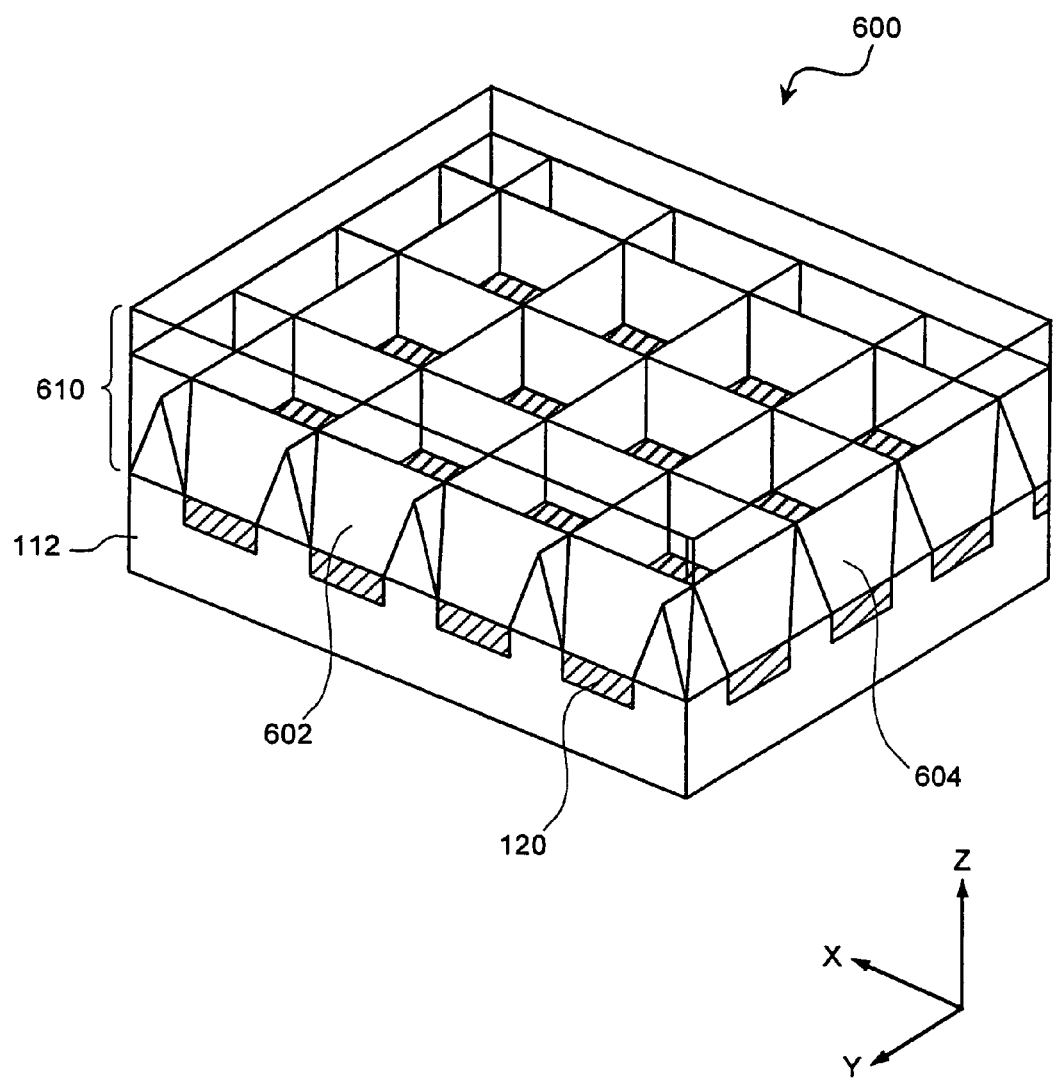
FIG. 6 is a perspective view of a main part of a display device with a display element according to a third embodiment of the present invention.

FIG. 6 is a perspective view of a main part of a display device 600 that includes the display element according to a third embodiment of the present invention. The same or similar parts are designated by the same reference numerals as used in the first embodiment and overlapping explanations are omitted. The display device 600 is an organic EL display including an organic EL element that is the display element of the present invention. The display device 600 includes the substrate 112 and an angle converting unit 610 laminated on the substrate 112. The angle converting unit 110 is a parallel plate made of a transparent member that has a refractive index of n. The angle converting unit 610 has prism structures 602 and 604 on the surface on the side of the substrate 112.

Figure 7:
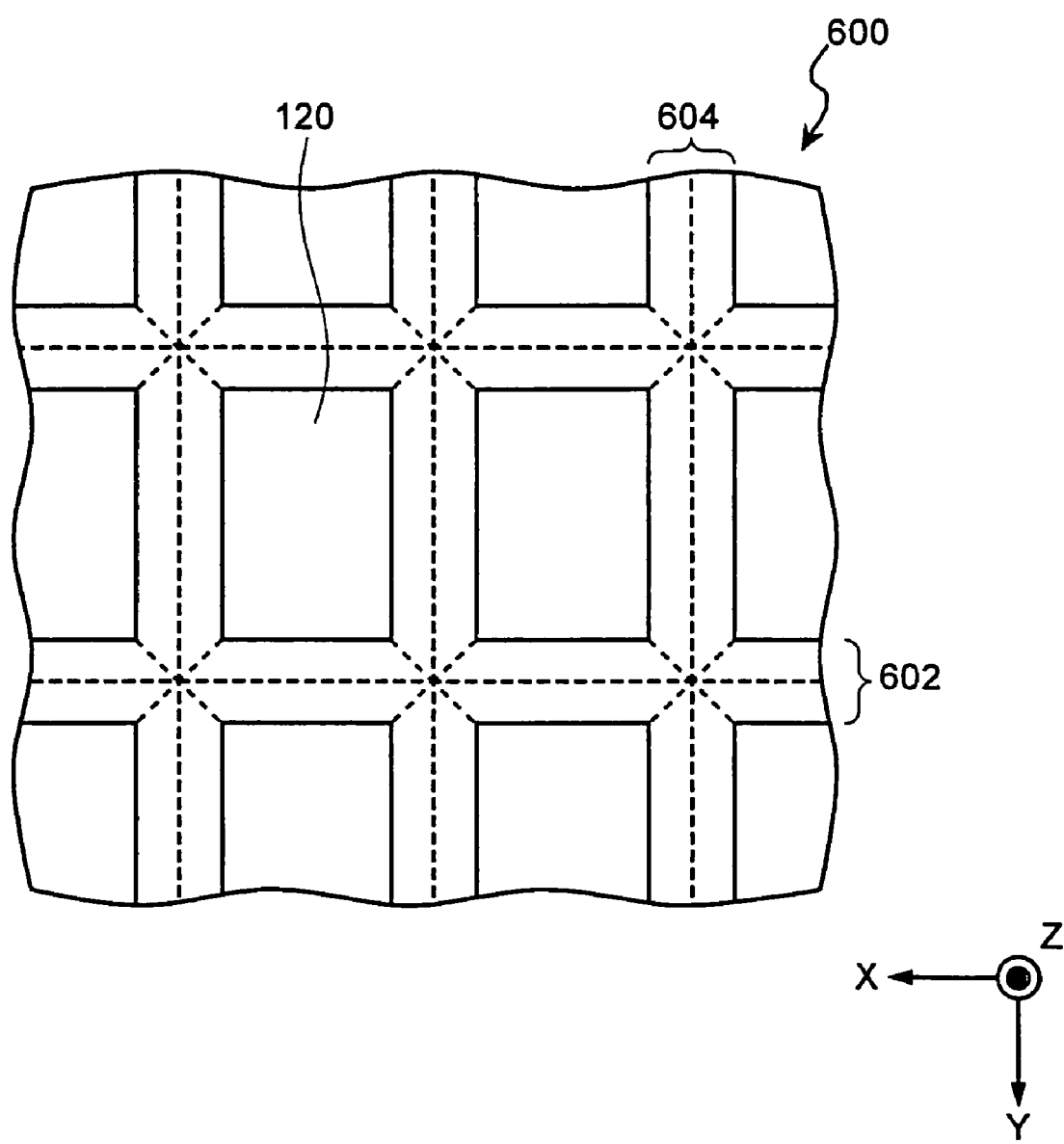
FIG. 7 is a plan view of a main part of the display device shown in FIG. 6.

FIG. 7 is a top plan view of a main part of the display device 600. The top plan configuration shows a state in which the prism structures 602 that are oblong in the X direction and the prism structures 604 that are oblong in the Y direction cross at substantially right angles to each other. The prism structures 602 and 604 are arranged between the light emitting units 120. The prism structures 602 have reflection surfaces that are oblong in a first direction, which is the X direction. The prism structures 604 have reflection surfaces that are oblong in a second direction, which the Y direction. The prism structures 602 and 604 are defined by a reflection surface of an organic EL element and a reflection surface of an organic EL element adjacent thereto, which reflection surfaces abut each other. The angle converting unit 610 includes reflection surfaces that are oblong in the X direction and reflection surfaces that are oblong in the Y direction.

Referring back to FIG. 6, the angle converting unit 610 has an output surface over the entire surface opposite to the side of the substrate 112. The output surface is a plane substantially parallel to the standard plane SS. A single unit of the organic EL element includes one light emitting unit 120 and a part of the angle converting unit 610 which part corresponds to the light emitting unit 120. The display device 600 includes a plurality of organic EL elements that are arranged corresponding to pixels. FIG. 6 is a perspective view of a main part of the display device 600 in which four organic EL elements in the X direction and three organic EL elements in the Y direction arranged in the form of a matrix.

The light emitting unit 120 generates light and supplies the light on the side where the angle converting unit 610 is provided. The light from the light emitting unit 120 in the direction nearly perpendicular to the standard plane is directly emitted to the outside through the emitting surface of the angle converting unit 610. On the other hand, the light from the light emitting unit 120 obliquely reflects from the reflection surfaces of the prism structures 602 and 604 and then emitted through the output surface of the angle converting unit 610. The angle converting unit 610 reflects the light that is incident to the reflection surface from the light generating toward the output surface to change the angle of the light with respect to the standard plane. The angle of the light from the light emitting unit 120 that travels obliquely with respect to the standard plane is changed in such a manner that the angle of incidence of the light with respect to the output surface is equal to or below the critical angle. The angle converting unit 610 reduces total reflection from the output surface by changing the angle of the light from the light emitting unit 120. The display device 600 provided with the angle converting unit 610 enables one to take out the light from the light emitting unit 120 to the outside efficiently.

Figure 8:
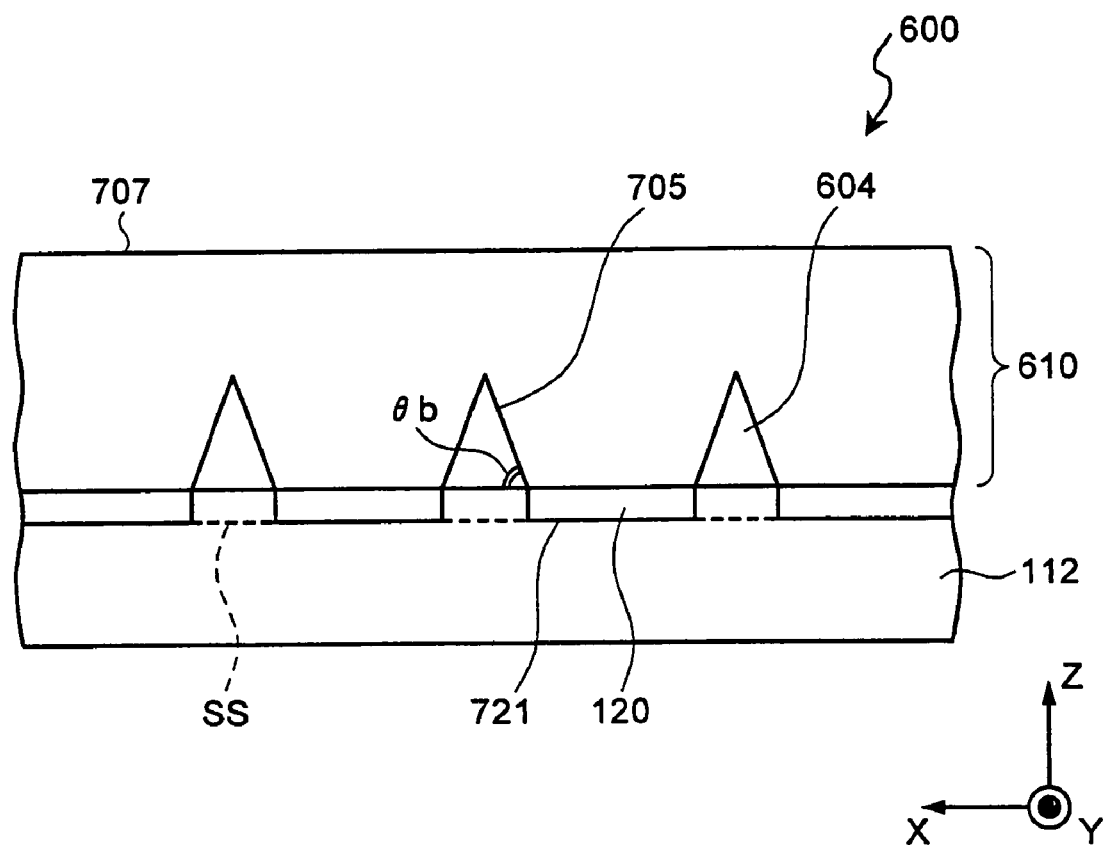
FIG. 8 is a cross-section of a main part of the display device shown in FIG. 6.

FIG. 8 is a cross-section of a main part of the display device 600. The prism structures 604 are arranged parallel in the Y direction and at a predetermined pitch in the X direction. The light emitting units 120 are provided on the standard plane SS. Each light emitting unit 120 has a low reflection electrode 721 on the standard plane SS. The low reflection electrode 721 is a low reflection portion made of a member having a predetermined reflection ratio or less of the incident light. The low reflection electrode 721 can be formed, for example, by laminating titanium on indium tin oxide (hereafter, also referred to as "ITO" for short). Each of the prism structures 602 has two reflection surfaces 705 provided on the side of the light emitting unit 120. The reflection surfaces 705 are substantially planar, inclined surfaces having an angle θb with respect to a plane that is parallel to the standard plane SS on which the light emitting units 120 are provided. The reflection surfaces 705 are provided inclined in such a manner that the space defined between the reflection surfaces widen from the light emitting unit 120 toward an output surface 707. The reflection surfaces 705 are provided on the periphery of each light emitting unit 120.

The reflecting surfaces 705 can be formed by, for example, forming a metal thin film. The materials of the metal thin film that can be used include, for example, aluminum and silver. The metal thin film can be formed by vapor depositing or patterning a metal material on the surface of the angle converting unit 610 on the side of the substrate 112 before the angle converting unit 610 and the substrate 112 are laminated. When the reflection surfaces 705 are formed by the forming of a metal thin film, the prism structures 602 and 604 can be formed by filling an adhesive in the cavities formed in the angle converting unit 610.

Figure 9:
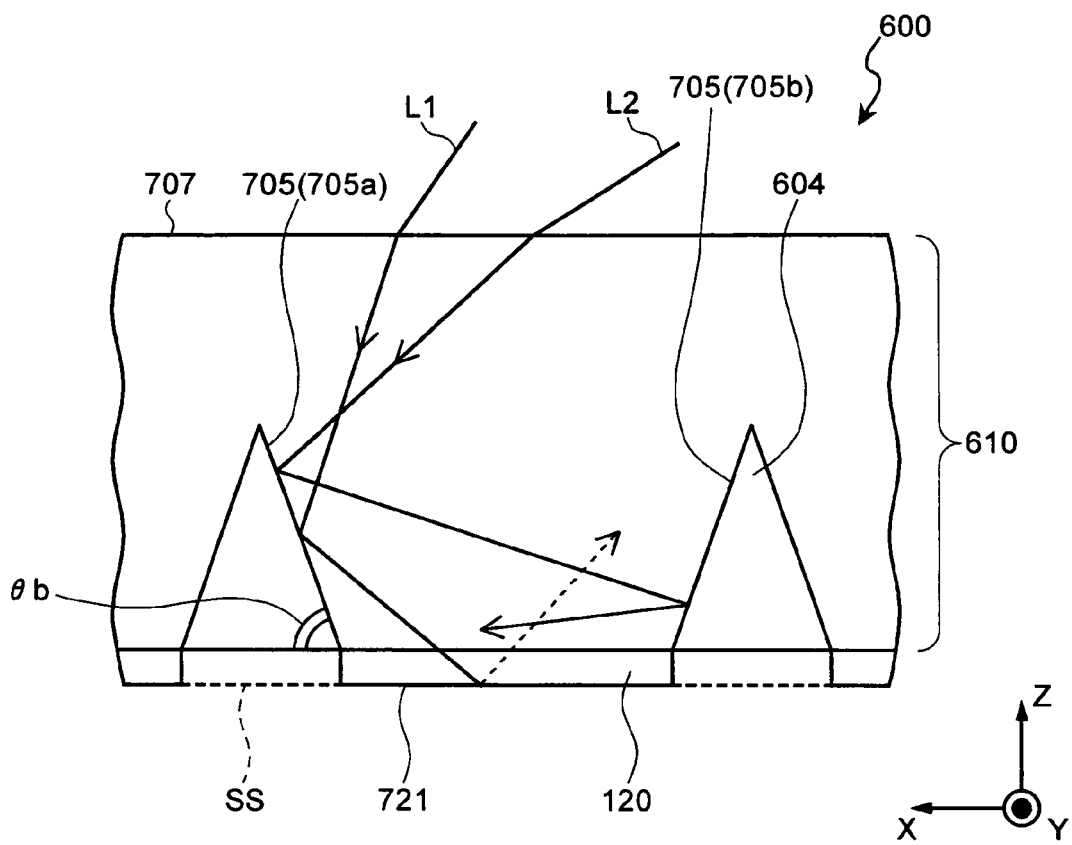
FIG. 9 is a schematic for explaining how external light that enters the display device shown in FIG. 6 travels.

FIG. 9 is a schematic for explaining how external light that enters the display device 606 through the output surface 707 travels. The display device 600 may cause a reduction in contrast because of illumination light in the room or external light such as sunlight that travels toward the observer in the same manner as the light from the light emitting unit 120. In the organic EL element of the present invention, the low reflection electrode 721 provided therein can reduce the reflection of the external light, which travels from the emission side to the light emitting unit 120, toward the observer.

The organic EL element of the present invention in the display device 600 is configured to satisfy the inequality (3)

$$\{a \sin(1/n)\}/2 + \pi/4 < \theta b < \pi/2 \qquad (3)$$

where θb is an angle (radian) between the reflection surface 705 and the standard plane SS; and n is a refractive index of the material that constitutes the angle converting unit 610. The angle θb is shown as an angle between the reflection surface 705 and a plane that is parallel to the standard plane SS. For example, assuming the refractive index n of the angle converting unit 610 to be 1.5 (n=1.5), the reflection surface 705 can be provided at the angle θb that is greater than 65.9° and smaller than 90° with respect to the standard plane SS (65.9<θb<90) according to the inequality (3).

The organic EL element of the display device 600 with the reflection surfaces 705 the angle of which with respect to the standard plane SS is limited to the range as defined by the inequality (3) does not allow the external light L1 that is incident to the reflection surface 705 from the output surface side 707 to be reflected toward the side of the output surface 707 and instead allows the external light L1 to travel in the direction of the light emitting unit 120. The external light L1 that travels in the direction toward the light emitting unit 120 is incident to the low reflection electrode 721, so that the travel of the external light L1 toward the output surface can be reduced. External light L2 that is incident to the display device 600 at an angle of incidence greater than that of the external light L1 is incident to the reflection surface 705*a* and then incident to the reflection surface 705*b* that is opposite to the reflection surface 705*a*. The external light L2 that is incident to the reflection surfaces 705*a* and 705*b* downward is attenuated while the reflection is repeated between the reflection surfaces 705*a* and 705*b*.

Some of the light that travels from the reflection surface 705*a* to the opposite reflection surface 705*b* may travel toward the emission side. The light that reflects twice, that is, reflects from the reflection surfaces 705*a* and 705*b* totally reflects from the output surface 707 to travel toward the side of the light emitting unit 120 again. The twice reflected light can be attenuated by reflecting the light from, for example, the reflecting surface 705.

Figure 10:
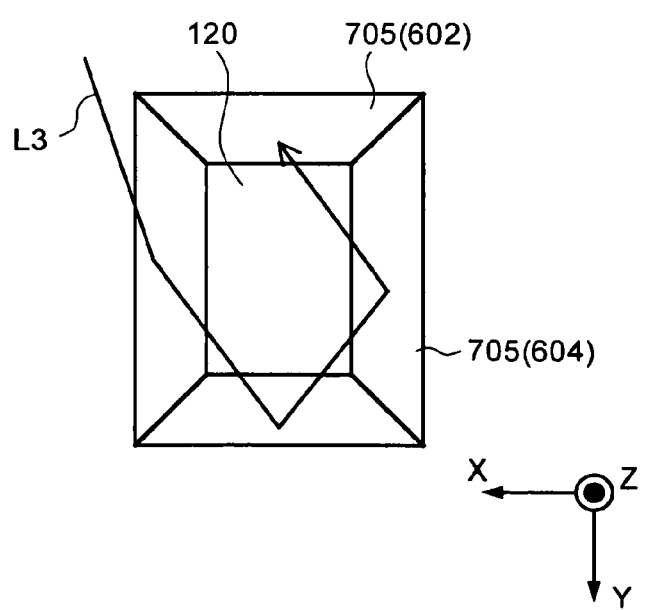
FIG. 10 is a schematic for explaining how light reflects between adjacent reflection surfaces.

FIG. 10 is a schematic for explaining how external light L3 is repeatedly reflected between the reflection surface 705 of the prism structure 602 and the reflection surface 705 of the prism structure 604. The organic EL elements of the display device 600 can reduce the amount of the external light not only by reflecting the external light L3 between the reflection surfaces 705 (705*a* and 705*b*) but also by reflecting the external light L3 between the adjacent reflecting surfaces 705 (the reflection surface 705 of the prism structure 602 and the reflection surface 705 of the prism structure 604). The external light L3, which travels rotating around the light emitting unit 120 reflected by the reflection surfaces, is attenuated while the reflection is repeated. An increasing number of times of reflection results in an increasing degree of reduction in the amount of the light.

Accordingly, the organic EL elements of the display device 600 can prevent the external light that is incident to the reflection surface 705 from the emission side from being emitted toward the side of the observer after reflected from the reflection surface 705 once or twice. The amount of the external light that reflects from the reflection surfaces 705 three times or more can be reduced by repeating the reflection. The amount of the external light that is incident to the light emitting unit 120 from the emission side and then travels toward the emission side can be reduced by providing the low reflection electrode 721. This can minimizes a reduction in contrast when light is efficiently output from the light emitting unit 120.

The organic EL element of the present invention can reduce a decrease in contrast of images particularly under a light room environment. The organic EL element may be provided with an optical film on the output surface 707 of the angle converting unit 610 to prevent reflection. For example, the decrease in contrast can be further reduced by providing an optical film that can prevent the reflection of the external light from the output surface 707 and allows the light from the light emitting unit 120 to transmit through the output surface 707 to the outside.

Figure 11:
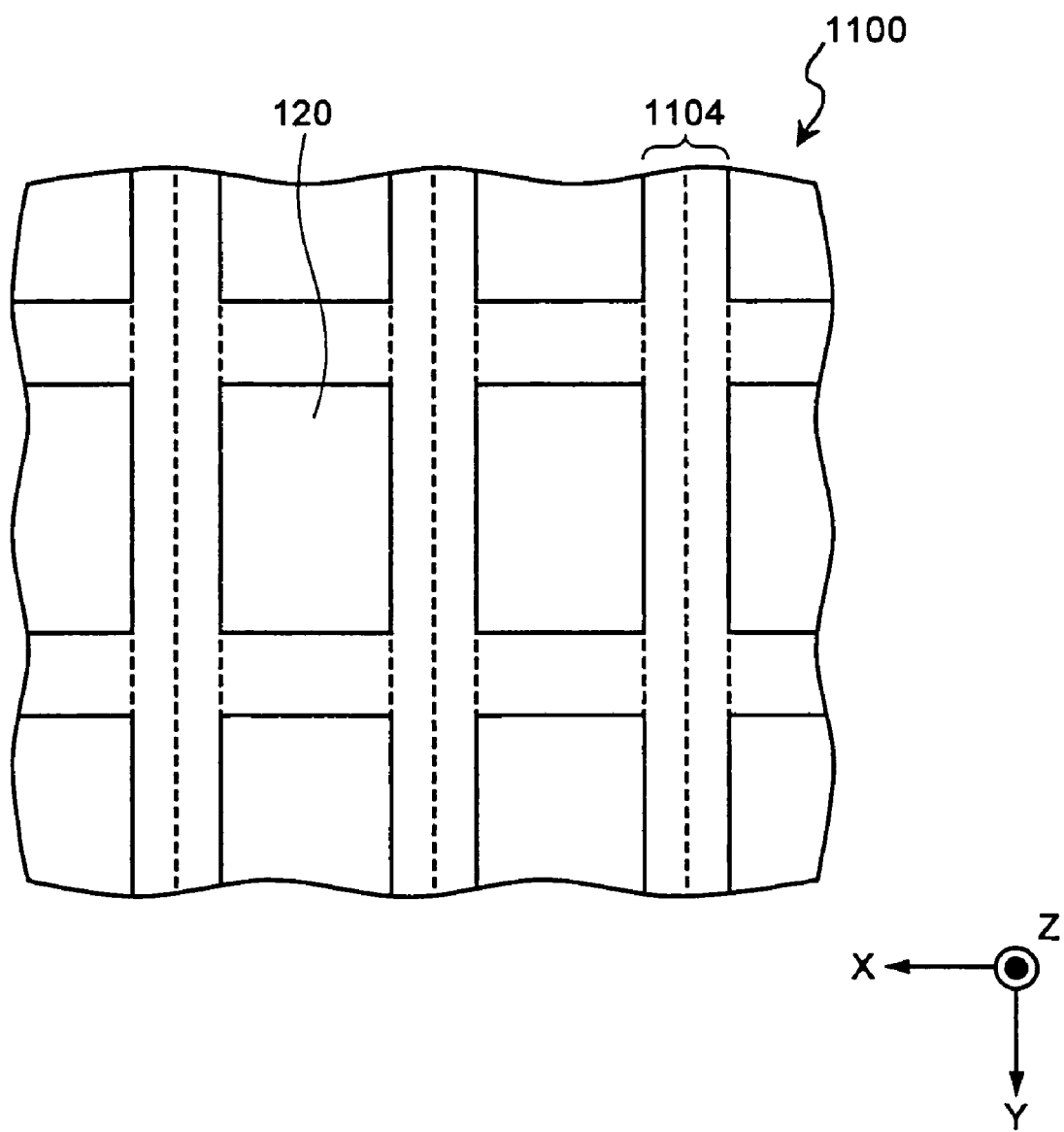
FIG. 11 is a schematic of the display element according to a variation of the third embodiment of the present invention.

FIG. 11 is a schematic of a display element according to a variation of the third embodiment of the present invention. An organic EL element of a display device 1100 is provided no prism structures that are oblong in the X direction, one of two directions that cross each other at substantially right angles on the standard plane SS. The organic EL element is provided with only prism structures 1104 that are oblong in the Y direction, the other of the above-mentioned two directions. The organic EL element according to the present variation has reflection surfaces that are oblong in the Y direction. The organic EL element of the display device 1100 can reduce a decrease in contrast by providing therewith the reflection surfaces having the angle θb that satisfies the inequality (3) only in one of the two directions that are at substantially right angles to each other. Which of the two directions that cross at substantially right angles to each other to be a longitudinal direction of the reflection surfaces can be determined appropriately depending on a main direction of incidence of the external light that enters the display device 1100.

Figure 12:
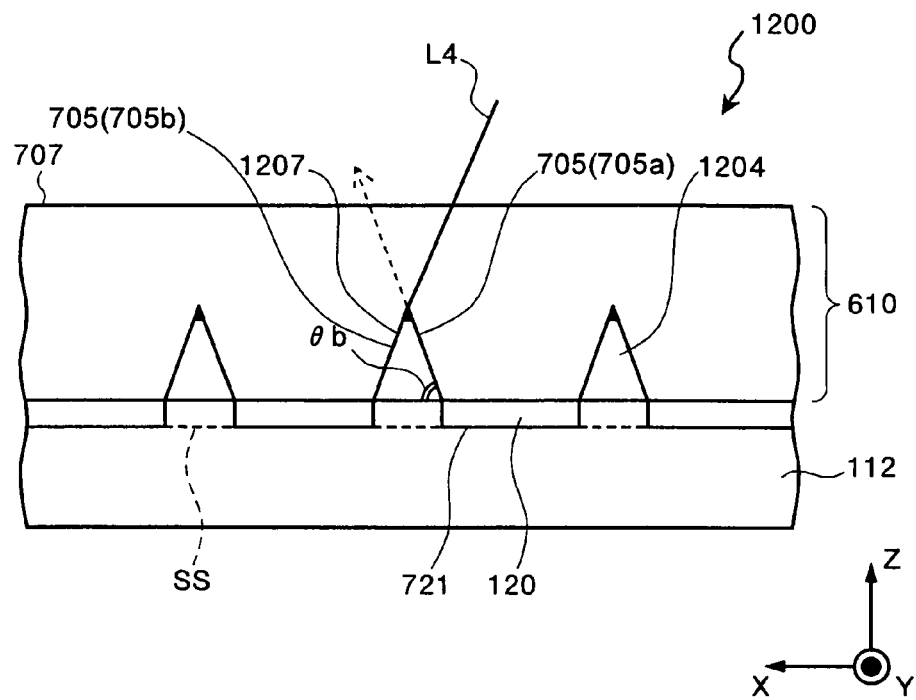
FIG. 12 is a cross-section of a main part of a display device with a display element according to a fourth embodiment of the present invention.

FIG. 12 is a cross-section of a main part of a display device 1200 with a display element according to a fourth embodiment of the present invention. The organic EL element, which is a display element of the present invention, is featured by having a light absorbing portion 1207. The same parts as that in the display element according to the third embodiment are designated by the same reference numerals and overlapping explanation is omitted. Prism structures 1204 are oblong in the Y direction. The contour of each prism structure 1204 is defined by the reflection surface 705*a* of one organic EL element and the reflection surface 705*b* of an organic EL element adjacent thereto, which reflection surfaces abut each other at a position on the emission side. Each prism structure 1204 has an edge at the position where the two reflection surfaces 705*a* and 705*b* abut each other. The light absorbing portion 1207 is provided on the edge of the prism structure 1204. The light absorbing portion 1207 is provided in the tip of the prism structure 1204, which is in the form of an isosceles triangle.

The light absorbing portion 1207 can be made of a material that absorbs visible light, such as black resin. External light L4 that is incident to the light absorbing portion 1207 from the emission side is absorbed by the light absorbing portion 1207. By providing the light absorbing portion 1207, the light that is incident to the edge of the prism structure 1204 is prevented from being reflected toward the emission side. This reduces the external light that reflects and travels toward the emission side, thereby reducing a decrease in contrast. Since the light absorbing portion 1207 is provided on the edge where the reflection surfaces 705 abut each other, absorption of the display light by the light absorbing portion 1207 can decrease. This makes it possible to configure the organic EL element to absorb only the external light, so that the decrease in contrast can reduce.

To further reduce the absorption of the display light in the light absorbing portion 1207, it is desirable that the light absorbing portion 1207 be designed to have a length as small as possible in the direction in which the display light is emitted, that is, the Z direction. By designing the length in the Z direction as small as possible, the light from the light emitting unit 1207 can be prevented from being incident to the light absorbing portion 1207 to further decrease absorption of the display light by the light absorbing portion 1207. The light absorbing portion 1207 may be provided not only to the prism structures 1204 that are oblong in the Y direction but also to the prism structures 1204 that are oblong in the X direction.

Figure 13:
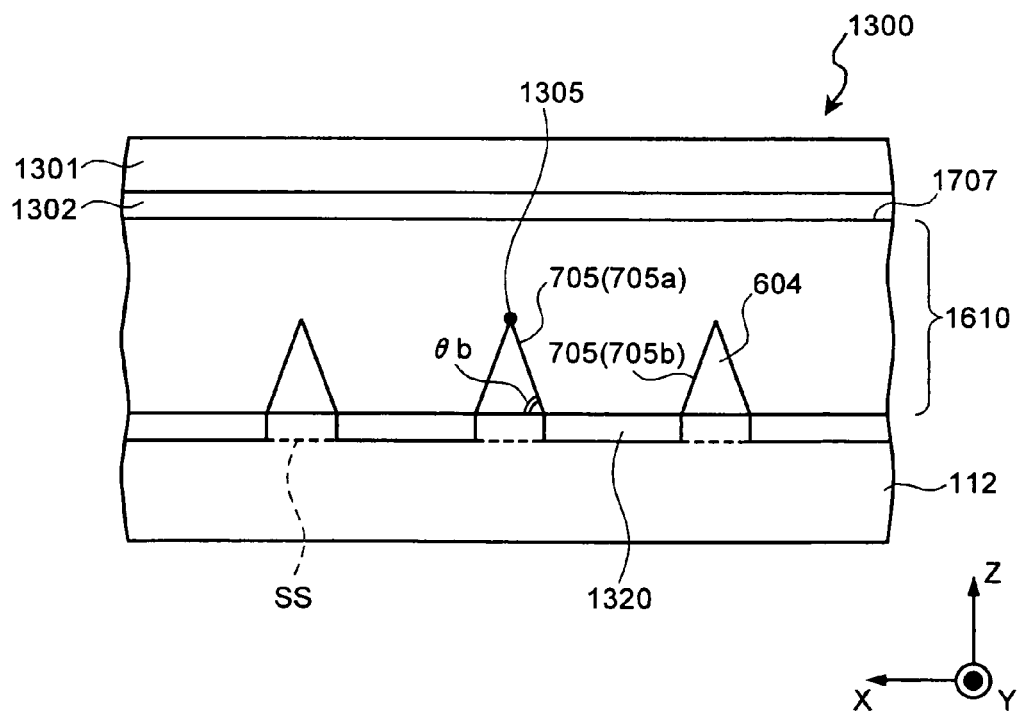
FIG. 13 is a cross-section of a main part of a display device with a display element according to a fifth embodiment of the present invention.

FIG. 13 is a cross-section of a main part of a display device 1300 with a display element according to a fifth embodiment of the present invention. The organic EL element, which is a display element of the present invention is featured by having a polarizing plate 1301. The parts the same as those in the display device 600 are designated by the same reference numerals and overlapping explanation is omitted. A λ/4 phase plate 1302 is provided on an output surface 1707 of the angle converting unit 1610. The polarizing plate 1301 is provided on an output surface of the λ/4 phase plate 1302. The polarizing plate 1301 transmits only polarized light that vibrates in a specified direction, for example, p-polarized light.

When external light enters the display device 1300 from the emission side, the polarizing plate 1301 transmits only p-polarized light component out of the external light. The p-polarized light component that transmitted the polarizing plate 1301 is converted from linearly polarized light to circularly polarized light through the λ/4 phase plate 1302. The circularly polarized light reflects from the reflection surface 705 or a reflection electrode in a light emitting unit 1320 to be incident to the λ/4 phase plate 1302. The light component that remains circularly polarized in the light that is incident to the λ/4 phase plate 1302 is then converted to s-polarized light. The light converted to s-polarized light and emitted from the λ/4 phase plate 1302 is blocked by the polarizing plate 1301. The display device 1300 provided with the polarizing plate 1301 can minimize the returning of the external light to the emission side.

The phase of the linearly polarized light is changed to λ/2 when the linearly polarized light transmits through the λ/4 phase plate 1302 twice. Utilizing this phenomenon, the polarized light that has transmitted through the polarizing plate 1301 and vibrates in a specific oscillation direction can be converted to a polarized light that vibrates in a direction other than the specific oscillation direction before the light enters the polarizing plate 1301 again. The circularly polarized light that travels through the angle converting unit 1610 may cause a change in phase due to reflection from the reflection electrode or reflection surface 705. The light of which the phase has changed by about π/2 due to the reflection from the reflection electrode or reflection surface 705 is considered to enter the polarizing plate 1301 as a polarized light that vibrates in a specific oscillation direction. The polarized light that vibrates in the specific oscillation direction can cause a reduction in contrast when the light transmits the polarizing plate 1301 and returns to the emission side.

When the reflection surfaces 705 are formed with a metal thin film, the phase of the light that reflects from the reflection surfaces 705 changes depending on the angle of incidence. The display device 1300, like the display device 600 according to the third embodiment, is provided with reflection surfaces 705 at a predetermined angle with respect to the standard plane SS. The light that travels from the reflecting surface 705a to the reflecting surface 705b is totally reflected from the output surface 707 of an angle converting unit 1610 to travel on the side of the light emitting unit 1320. The amount of the light that reflects from the reflection surface 705 twice, i.e., reflected from the reflection surfaces 705a and 705b and then travels on the side of the light emitting unit 1320 can be reduced by reflecting the twice reflected light again from, for example, the reflection surface 705. From this it follows that the amount of the light that reflects from the reflecting surface 705 twice and enters the polarizing plate 1301 can be reduced. As a result, the amount of the external light that transmits through the polarizing plate 1301 and returns to the emission side can be reduced, thereby reducing a decrease in contrast.

The organic EL element of the display device 1300 may include a low reflection electrode in each light emitting unit 1320. With the configuration in which the low reflection electrode is provided in the light emitting unit 1320, the light that is incident to the light emitting unit 1320 directly or after being reflected from the reflection surface 705 can be prevented from traveling in the direction of the polarizing plate 1301. This can reduce the amount of the external light that transmits through the polarizing plate 1301 and returns to the emission side.

The organic EL element of the display device 1300, like the third embodiment, includes the prism structures 602 and 604. The prism structures 602 and 604 are provided on the substrate 112 in such a manner that the prism structures 602 and 604 have substantially the same height in the direction of a normal line to the standard plane SS, that is, in the Z direction. The height, h, of the prism structures 602 and 604 is a distance from the surface of the substrate 112 to an edge 1305 of each prism structure.

Figure 14:
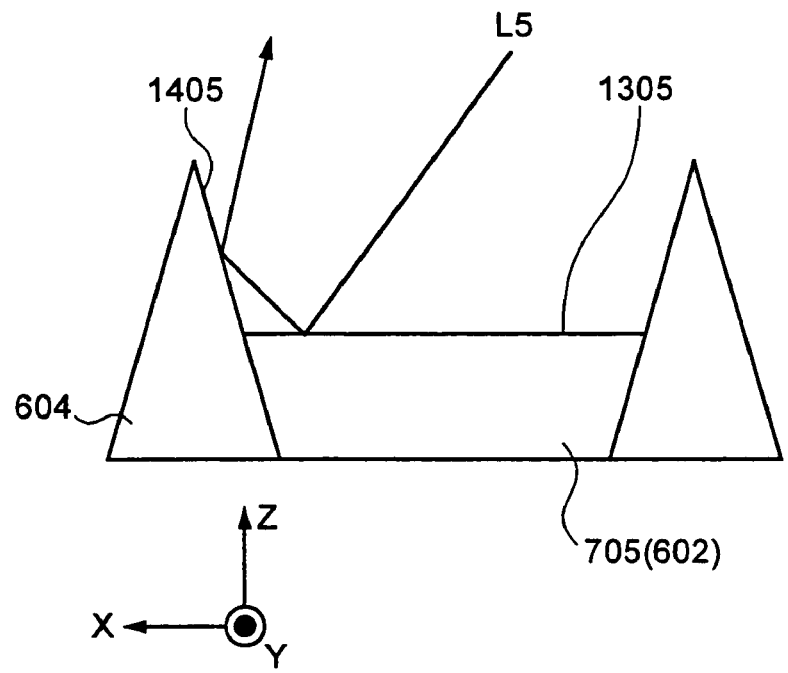
FIG. 14 is a schematic for explaining how light reflects from an edge of a prism structure.

How the light reflects from the edge 1305 of the prism structure 602 is explained. FIG. 14 is a schematic for explaining how light reflects when the prism structures 604 are made higher than the prism structures 602 as a comparison with the organic EL element according to the fifth embodiment. In some cases, external light L5 that reflects from the edge 1305 of the prism structure 602 reflects on a reflection surface 1405 of the prism structure 604 that is adjacent to the prism structure 602 and travels to the emission side. The light that reflects a plurality of times from the edge 1305, reflection surface 705 and the reflection surface 1405 and travels to the emission side has a considerable shift in phase, so that the light may transmit through the polarizing plate 1301.

Figure 15:
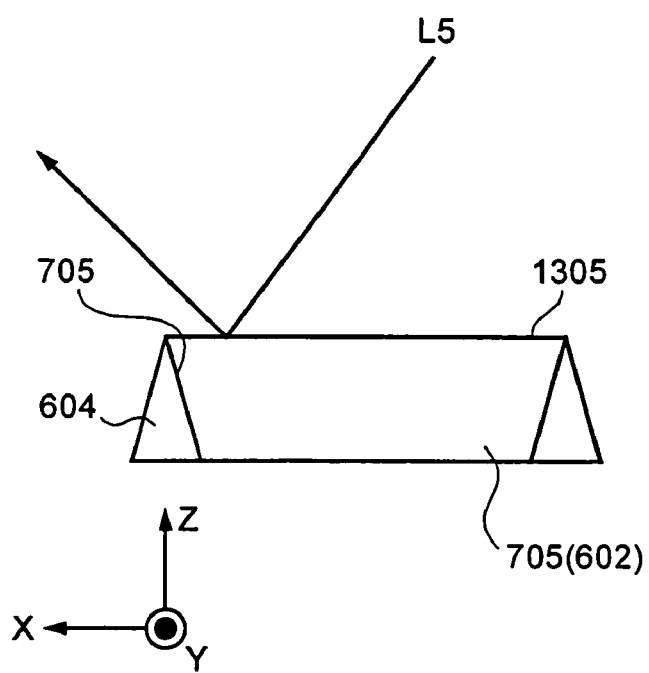
FIG. 15 is a schematic for explaining how light reflects from an edge of a prism structure.

FIG. 15 is a schematic for explaining how light reflects when the prism structures 602 and the prism structures 604 having substantially the same height are provided. When the prism structures 602 and 604 have substantially the same height, the external light L5 that reflects from the edge 1305 can be prevented from reflecting from the adjacent reflection surface 705. Since the external light L5 that reflects from the edge 1305 only has a less shift in phase, the external light L5 that reflects on the edge 1305 is blocked by the polarizing plate 1301. In this manner, the external light that reflects from the edges 1305 of the prism structures 602 and 604 is prevented from traveling toward the emission side. This can reduce a decrease in contrast.

The display devices according to the above-mentioned embodiments include organic EL elements as display elements. However, the present invention is not limited by use of the organic EL elements. For example, the display element may be solid light emitting elements such as inorganic EL elements and light emitting diode (LED) elements. The display devices that include the display elements of the present invention can be applied to display panels for electronic devices. The display panels that include the display elements of the present invention can be widely applied to various electronic devices such as mobile phones, personal computers, word processors, personal digital assistants (PDA), which are mobile type information technology (IT) devices, television, and car navigators. The display elements of the present invention can be widely applied to illumination devices, electronic paper and so on.

Although the invention has been described with respect to a specific embodiment for a complete and clear disclosure, the appended claims are not to be thus limited but are to be construed as embodying all modifications and alternative constructions that may occur to one skilled in the art that fairly fall within the basic teaching herein set forth.

What is claimed is:
1. A method of manufacturing a display element that includes:

a light emitting unit that is provided on a standard plane, and supplies light; and an angle converting unit including:
- a prism structure having a reflection surface that is provided on a periphery of the light emitting unit, and reflects the light supplied from the light emitting unit,
- an output surface that outputs the light from the light emitting unit and the reflection surface, and
- a flat surface that is parallel with the output surface and provided between adjacent reflection surfaces, the method comprising:

forming a geometrical shape of the angle converting unit that satisfies a following inequality $$0 \leq t < p(p-d-f)(\tan \theta a)/(p+d-f)$$

where t is a distance between the flat surface and the output surface, p is a pitch at which the light emitting unit is arranged in a predetermined direction, d is a length of the light emitting unit in the predetermined direction, f is a length of the flat surface in the predetermined direction, and $\theta a$ is an angle between the reflection surface and the standard plane.

2. The method according to claim 1 further comprising:
forming the reflection surface, wherein the forming of the reflection surface includes vapor depositing and patterning a metal material on an opposite surface of the angle converting unit on a side of a substrate before the angle converting unit and the substrate are bonded.

3. The method according to claim 2, wherein the vapor depositing and patterning of the metal material includes aluminum.

4. The method according to claim 2, wherein the vapor depositing and patterning of the metal material includes silver.

5. The method according to claim 2, the prism structure is formed by filling an adhesive in the cavities formed in the angle converting unit.

6. The method according to claim 1 further comprising:
bonding temporarily a holding substrate to a surface of a parallel plate with an adhesive, the parallel plate being made of a transparent resin material that constitutes the angle converting unit, wherein the adhesive is peelable by heating, immersing in water, or irradiation of ultraviolet rays.

7. The method according to claim 1, wherein when the reflection surface is a total reflection surface, the prism structure is formed by filling an inert gas including nitrogen gas in cavities defined by the total reflection surface, wherein the reflection surface totally reflects incident light by utilizing a difference in refractive index between a transparent resin material and the prism structure.

* * * * *